(12) United States Patent
Blodt et al.

(10) Patent No.: US 10,345,350 B2
(45) Date of Patent: Jul. 9, 2019

(54) METHOD FOR DETECTING HIGH-FREQUENCY SIGNALS

(71) Applicant: Endress + Hauser GmbH + Co. KG, Maulburg (DE)

(72) Inventors: Thomas Blodt, Basel (CH); Timo Schwall, Constance (DE)

(73) Assignee: ENDRESS+HAUSER SE+CO.KG, Maulburg (DE)

( * ) Notice: Subject to any disclaimer, the term of this patent is extended or adjusted under 35 U.S.C. 154(b) by 0 days.

(21) Appl. No.: 15/576,960

(22) PCT Filed: May 10, 2016

(86) PCT No.: PCT/EP2016/060395
§ 371 (c)(1),
(2) Date: Nov. 27, 2017

(87) PCT Pub. No.: WO2016/192932
PCT Pub. Date: Dec. 8, 2016

(65) Prior Publication Data
US 2018/0156849 A1    Jun. 7, 2018

(30) Foreign Application Priority Data
Jun. 3, 2015 (DE) .................. 10 2015 108 852

(51) Int. Cl.
*G01R 23/06* (2006.01)
*G01R 23/12* (2006.01)
*G01S 13/40* (2006.01)

(52) U.S. Cl.
CPC ............. *G01R 23/06* (2013.01); *G01R 23/12* (2013.01); *G01S 13/40* (2013.01)

(58) Field of Classification Search
CPC ....................................................... G01R 23/06
See application file for complete search history.

(56) References Cited

U.S. PATENT DOCUMENTS

| | | | |
|---|---|---|---|
| 2,857,465 A | | 10/1958 | Schroeder |
| 4,672,556 A | * | 6/1987 | Shepler .................. G01R 23/15 324/174 |

(Continued)

FOREIGN PATENT DOCUMENTS

| | | |
|---|---|---|
| DE | 102013108490 A1 | 2/2015 |
| DE | 102015108852 A1 | 12/2016 |

OTHER PUBLICATIONS

German Search Report, German Patent Office, Munich, DE dated Feb. 26, 2016.

(Continued)

*Primary Examiner* — Hai L Nguyen
(74) *Attorney, Agent, or Firm* — Bacon & Thomas, PLLC

(57) ABSTRACT

The invention relates to a method for detecting high-frequency signals (22), comprising method steps as follows: dividing a high-frequency signal (22) into a raw signal (3) and a reference signal (4), attenuating the raw signal (3) into an attenuated signal (9), wherein the attenuating happens as a function of frequency of the raw signal (3) in accordance with an attenuation characteristic, rectifying the attenuated signal (9), so that a first direct voltage (15) is generated, rectifying the reference signal (4), so that a second direct voltage (16) is generated, ascertaining an attenuation from the ratio of the first and second direct voltages (15, 16), wherein the ratio corresponds to an attenuation factor for the attenuation of the raw signal (3), determining the frequency of the high-frequency signal (22) from the attenuation factor and an attenuation characteristic (17).

7 Claims, 3 Drawing Sheets

(56) References Cited

U.S. PATENT DOCUMENTS

| | | | | |
|---|---|---|---|---|
| 5,896,049 A | * | 4/1999 | Saunders | G01R 23/10 |
| | | | | 327/39 |
| 8,970,255 B2 | * | 3/2015 | Tsai | H03K 5/26 |
| | | | | 327/102 |
| 2014/0239938 A1 | | 8/2014 | Kesterson | |

OTHER PUBLICATIONS

International Search Report, EPO, The Netherlands, dated May 10, 2016.

English Translation of the International Preliminary Report on Patentability, WIPO, Geneva, CH, dated Dec. 14, 2017.

Raul Loeches-Sanchez et al; "A Class of Planar Multi-Band Wilkinson-Type Power Divider with Intrinsic Filtering Functionality", 2015 IEEE; pp. 138-140.

* cited by examiner

METHOD FOR DETECTING HIGH-FREQUENCY SIGNALS

TECHNICAL FIELD

The invention relates to a method for detecting high-frequency signals in the 2.4 GHz range. In the case of such high-frequency signals, the exact frequency should be measured and converted into a digital value. The output power of the high-frequency signal amounts to a maximum of about 1 mW. The frequency bandwidth of the high-frequency signal amounts usually to about 35 MHz.

BACKGROUND DISCUSSION

In automation technology, especially in process automation, however, also in manufacturing automation, field devices are applied, which serve for determining and monitoring process variables. In connection with the invention, the terminology, field devices, refers to both actuators as well as also sensors. Sensors, for example, register different process variables, such as fill level, flow, pH-value, turbidity, substance concentration, pressure, temperature, moisture, conductivity, density and viscosity. A large number of such field devices are available from members of the firm, Endress+Hauser. Such field devices produce signals in the high-frequency region, which need to be evaluated, in order that the process variable can be determined from the evaluation of the high-frequency signal.

According to the state of the art, the frequency of a high-frequency signal is determined by fast counters. For this, the frequency is divided down a number of times, in order that the frequency can be handled by digital ICs. Alternatively or supplementally, also a mixer can be used, in order to remove the frequency offset (in the present case the 2.4 GHz). However, these concepts face certain limits at high frequencies. The general problem in the case of frequency dividers is that the actual wanted frequency is likewise divided by the same factor, which means that one must measure more exactly. Also, "normal" digital circuits reach, most often, only into frequency ranges of some 100 MHz. Chips for higher frequencies are, most often, expensive and/or possess an increased electrical current draw. Mixers are likewise expensive and have, most often, a high electrical current draw, i.e. a high conversion loss. Furthermore, a mixer must, in turn, be fed a high-frequency reference-signal having a very exactly maintained frequency.

SUMMARY OF THE INVENTION

An object of the invention is to provide a method and an apparatus, which determine the frequency of high-frequency signals precisely with simple means.

The object is achieved by the subject matter of the invention. Subject matter of the invention is a method for detecting high-frequency signals, comprising method steps as follows: dividing a high-frequency signal is into a raw signal and a reference signal, attenuating the raw signal into an attenuated signal, wherein the attenuating happens as a function of frequency of the raw signal in accordance with an attenuation characteristic, rectifying the attenuated signal, so that a first direct voltage is generated, rectifying the reference signal, so that a second direct voltage is generated, ascertaining an attenuation from the ratio between the first and second direct voltages, wherein the ratio corresponds to an attenuation factor for the attenuation of the raw signal, determining the frequency of the high-frequency signal from the attenuation factor and an attenuation characteristic.

A great advantage of this method is the low number of required components. Since most HF-components are implemented with line elements, tolerances and temperature dependences are essentially less significant than in the case of construction with passive or even active components. Furthermore, the method is quite advantageous, since few and, above all, few active, components are used. A further advantage is the low energy consumption. Except for amplifiers for level matching and an A/D converter, no external energy supply is required. The time, which the A/D converter needs, in order to convert an input value and therewith the time, during which an external energy supply is used, is relatively short and lies typically in the order of magnitude of 20-30 clock cycles. Also, the absolute amplitude of the circuit at the input no longer plays a role, since such is used as reference for the A/D converter.

In an advantageous form of embodiment, the attenuating of the raw signal into an attenuated signal happens by distributing the raw signal to at least first and second lines of an attenuating member, wherein the first and second lines have different lengths, whereby a frequency dependent phase difference between a first signal of the first line and a is second signal of the second line arises, wherein the first and second signals are superimposed at an output of the attenuating member to form the attenuated signal.

In an advantageous variant, the first and second direct voltages are digitized, before the attenuation is ascertained.

The object of the invention is likewise achieved by a method for determining a physical or chemical process variable using at least one sensor, which produces high-frequency signals, whose frequency varies as a function of the at least one process variable, comprising steps as follows, detecting the high-frequency signals by means of a method of the invention.

The object of the invention is further achieved by an apparatus. The apparatus for detecting high-frequency signals comprises a signal divider for dividing a high-frequency signal into a raw signal and a reference signal, an attenuating member for attenuating the raw signal, wherein the attenuating member has a defined attenuation characteristic, a first rectifier for rectifying the attenuated signal to a first direct voltage, a second rectifier for rectifying the reference signal to a second direct voltage, a comparator for forming the ratio of the first and second direct voltages, a processor for ascertaining the frequency of the high-frequency signal from the attenuation of the raw signal and the attenuation characteristic of the attenuating member.

In an advantageous embodiment, the attenuating member includes at least first and second lines for distributing the raw signal, wherein the at least first and second lines have different lengths, so that a frequency dependent phase difference arises between a first signal of the first line and a second signal of the second line, wherein the attenuating member is has a junction at an output for superimposing the first and second signals, so that the first and second signals are superimposed at the output into an attenuated signal.

In an advantageous further development, the apparatus further includes an A/D converter for digitizing the first and second direct voltages.

An object of the invention is likewise achieved by a field device for measuring a physical or chemical process variable, comprising at least one sensor, which produces high-frequency signals, whose frequency varies as a function of the at least one process variable, and an apparatus of the invention for evaluating the high-frequency signals.

BRIEF DESCRIPTION OF THE DRAWINGS

The invention will now be explained in greater detail based on the appended drawing, the figures of which show as follows.

DETAILED DISCUSSION IN CONJUNCTION WITH THE DRAWINGS

Figure 1:
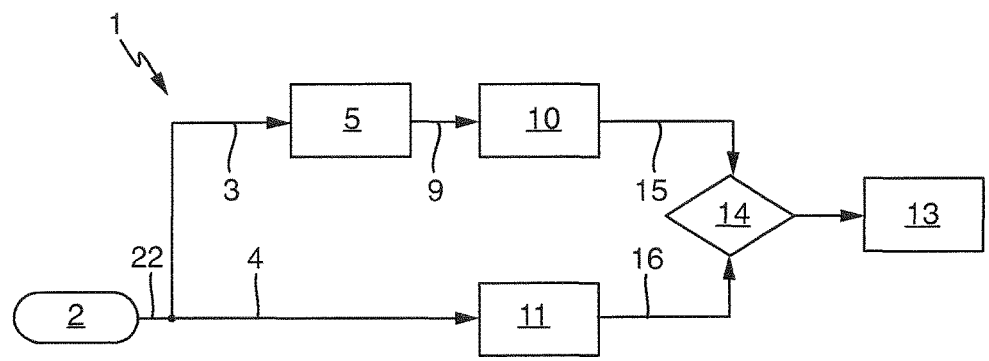
FIG. 1 is a block diagram of an apparatus for detecting high-frequency signals.

FIG. 1 shows a block diagram of an apparatus 1 for detecting high-frequency signals 22. The apparatus 1 includes a signal divider 2, which is able to divide a high-frequency signal 22 into a raw signal 3 and a reference signal 4. The raw signal 3 is fed to an attenuating member 5. The attenuating member 5 attenuates the raw signal 3 into an attenuated signal 9.

The attenuated signal 9 is fed to a first rectifier 10, whereby the attenuated signal 9 is rectified to a first direct voltage 15. At the same time, the reference signal 4 is fed to a second rectifier 11, whereby the reference signal 4 is rectified to a second direct voltage 16.

The first and second direct voltages 15, 16 are compared in an A/D converter 14. The ratio of the first and second direct voltages 15, 16 corresponds to an attenuation of the raw signal 3 in the attenuating member 5.

A processor 13 ascertains the frequency of the high-frequency signal 22 from the attenuation of the raw signal 3 and an attenuation characteristic of the attenuating member 5.

Figure 2:
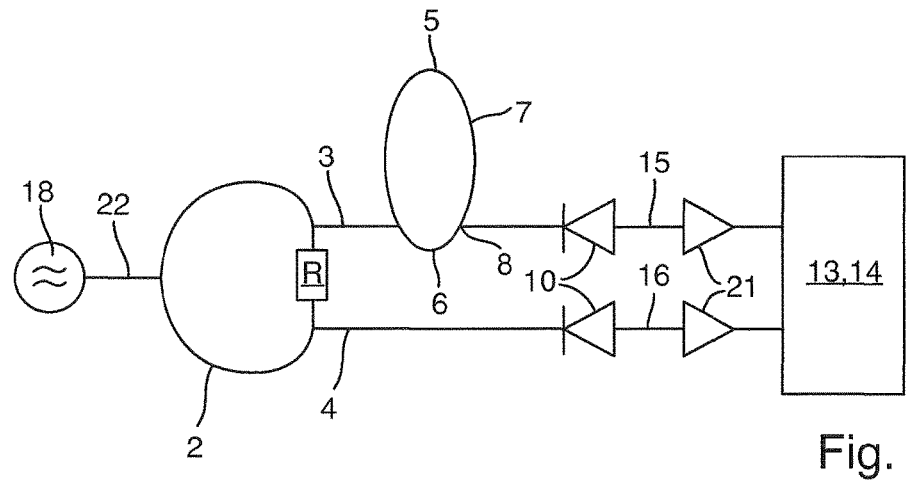
FIG. 2 is a circuit for implementing an apparatus of FIG. 1.

FIG. 2 shows a circuit for implementing an apparatus of FIG. 1. A signal source 18 produces a high-frequency signal 22, which in a first step passes through a signal divider 2, wherein the signal divider 2 is embodied as a Wilkinson divider. The signal divider 2 distributes the high-frequency signal 22 uniformly to a raw signal 3 and a reference signal 4. A resistor R connects the raw signal 3 and the reference signal 4, wherein the resistor R amounts to 100 ohm.

The raw signal 3 passes through an attenuating member 5. The attenuating member 5 is composed of first and second lines 6, 7, wherein the first and second lines 6, 7 have different lengths. In this way, the raw signal 3 is divided into first and second parts, which are joined at an output 8 of the attenuating member 5.

By dividing the raw signal 3 between two lines 6, 7 of different lengths, the phases of the first and second parts of the raw signal are rotated frequency dependently differently. Upon the joining at the output 8, interference occurs. The amplitude is now dependent upon the phases of the first and second parts of the raw signal 3 relative to one another.

The advantage of this attenuating member 5 in comparison to an attenuating member with passive components is the smaller temperature dependence and lower tolerances. The etching tolerances of modern methods lie at less than 75 micrometer. In the frequency range under discussion, this is much less than the wavelength and, thus, is of no consequence. The temperature dependence in the case of this attenuating member 5 is influenced by two aspects. On the one hand, there is the Dk-change over the temperature range; at the relevant frequencies here, the change can be neglected. On the other hand, there is the temperature related expansion of the copper, which likewise is relatively small. Over a temperature span of 160K, the maximum length change of the copper relative to the wavelength amounts to about 1 to 350. Thus, the influence of the thermal expansion of the copper on line parameters, such as, for example, length, travel time, phase difference, width and impedance, is negligibly small.

After the attenuating of the raw signal 3 in the attenuating member 5, the attenuated signal 9 is rectified to a first direct voltage 15 by means of the first rectifier circuit 10, which is embodied as a rectifier diode. At the same time, the reference signal 4 is rectified to a second direct voltage 16 by means of the second rectifier circuit 11, which likewise is embodied as a rectifier diode.

The first and second direct voltages 15, 16 serve for the actual determining of the amplitudes of the raw signal 3 and the reference signal 4, respectively. The first and second rectifier circuits 10, 11 can contain besides the rectifier diodes at least one capacitor (not shown). The rectifier diodes remove one of the half waves of the raw signal 3 and the reference signal 4, respectively. With the help of the at least one capacitor, the remaining half-wave is smoothed and a direct voltage results.

The first and second direct voltages 15, 16 are amplified by means of respective amplifiers 21. Then, the first and second direct voltages 15, 16 are fed to an A/D converter 14. In the A/D converter 14, the first and second direct voltages 15, 16 are compared. For this, the raw signal 3 and the reference signal 4 can be digitized. Depending on character of the A/D converter 14, in given cases, a preamplifier must be used, in order to deliver the needed voltage level to the A/D converter 14.

Figure 3:
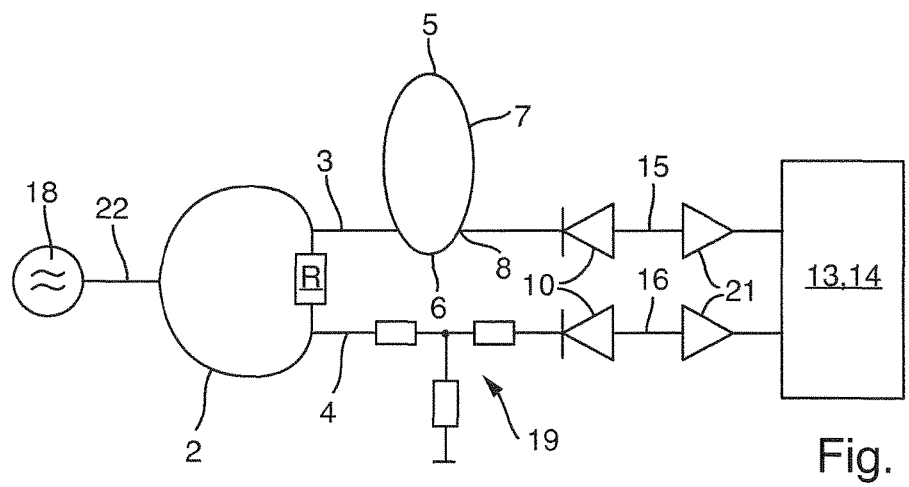
FIG. 3 is a circuit of FIG. 2 having a T-unit for power matching.

FIG. 3 shows a circuit of FIG. 2 having a T-unit 19 for power matching. The T-unit 19 is provided, in order to filter the reference signal 4 through the T-unit. The filtering of the reference signal 4 through the T-unit 19 is effects that the high-frequency signal 22 is divided with the same power fractions into a raw signal 3 and a reference signal 4. An asymmetric power distribution of the high-frequency signal 22 is likewise possible. This can be effected by a corresponding dimensioning of the T-member 19.

Figure 4:
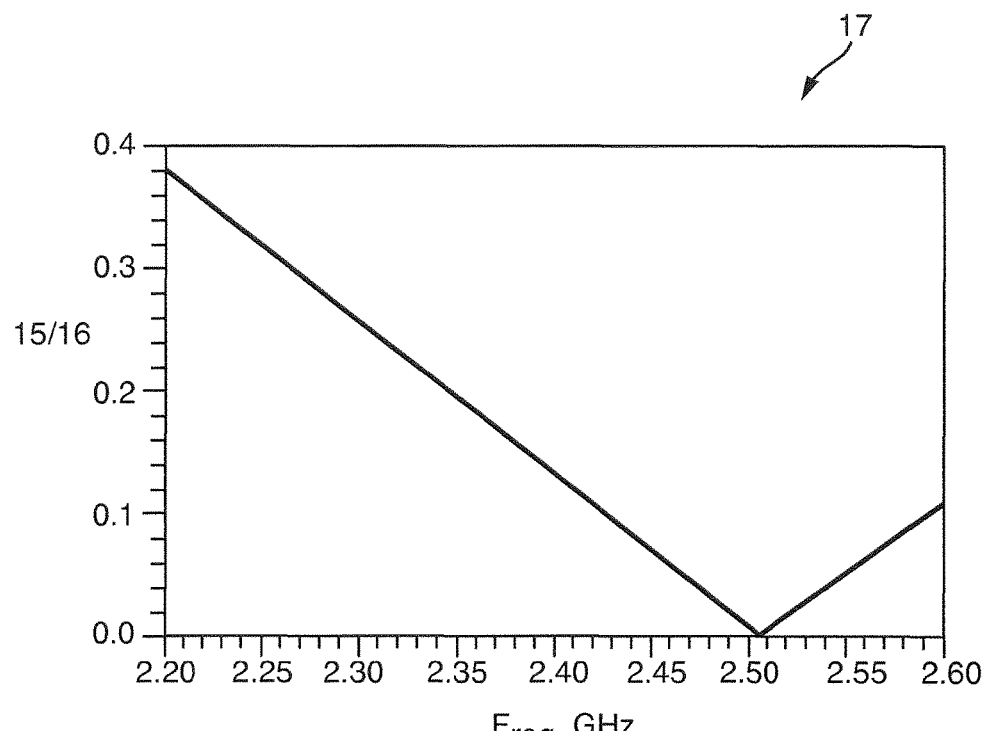
FIG. 4 is a graph of a typical attenuation characteristic of an attenuating member of FIG. 2, or FIG. 3.

FIG. 4 shows a graph of a typical attenuation characteristic 17 of an attenuating member of FIG. 2 or FIG. 3. The attenuation characteristic 17 must be known before start-up of the circuit. The abscissa gives the frequency and the ordinate the ratio of the amplitudes of the first and second direct voltages 15, 16. If a ratio of the direct voltages is ascertained from the circuit of FIG. 2 or FIG. 3, a frequency of the attenuation characteristic 17 belonging to this ratio can be read off. This frequency can be attributed to the high-frequency signal 22, whose frequency is to be determined.

Figure 5:
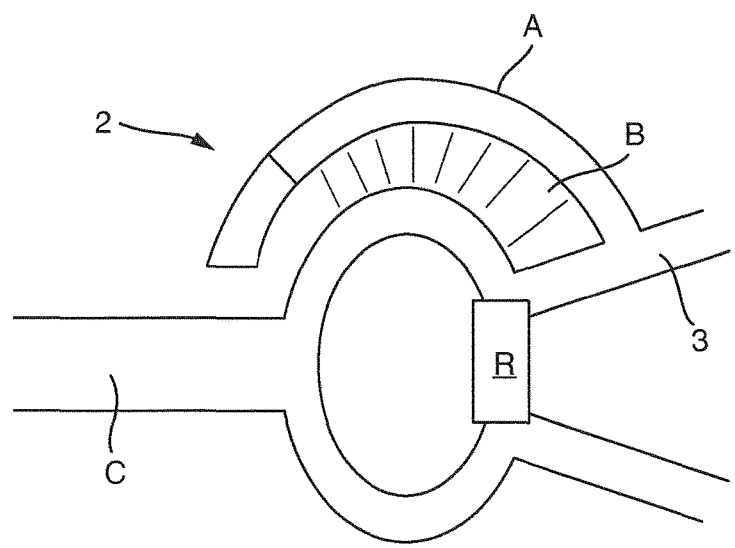
FIG. 5 is a sketch of a Wilkinson divider, in the case of which the attenuating member is integrated into the Wilkinson divider.

FIG. 5 shows a sketch of a signal divider 2 embodied as a Wilkinson divider, wherein the attenuating member is integrated into the Wilkinson divider. Arranged on a line carrying the raw signal 3 is a branch A, which joins the line carrying the raw signal 3. Branch A is longer than the line carrying the raw signal 3, and this results in a longer travel time of the raw signal 3 in the branch A. The raw signal 3 travels back via the branch A and is reflected on the end of the branch A. The branch A and its separation are so selected that the raw signal 3 significantly overcouples, when it gets back to the beginning of line A. In this way, raw signal 3 experiences interference, whereby the attenuating member is implemented. C is here the supply line and R is an optional resistor. From the different lengths of branch A and the rest of the line, the desired interference effect is obtained, as explained above in the case of FIG. 4.

Figure 6:
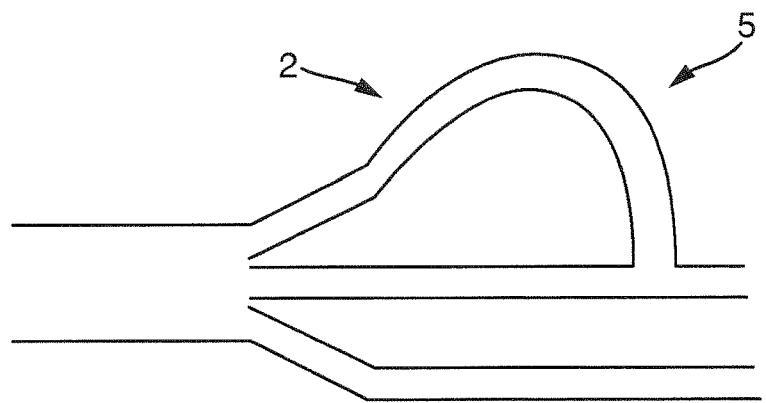
FIG. 6 is a sketch of a signal divider, which divides the high-frequency signal into three signal portions.

FIG. 6 shows a sketch of a signal divider 2, which divides the high-frequency signal 22 into three signal portions. The attenuating member 5 is likewise already implemented in the signal divider 2. In this way, components can be saved.

Figure 7:
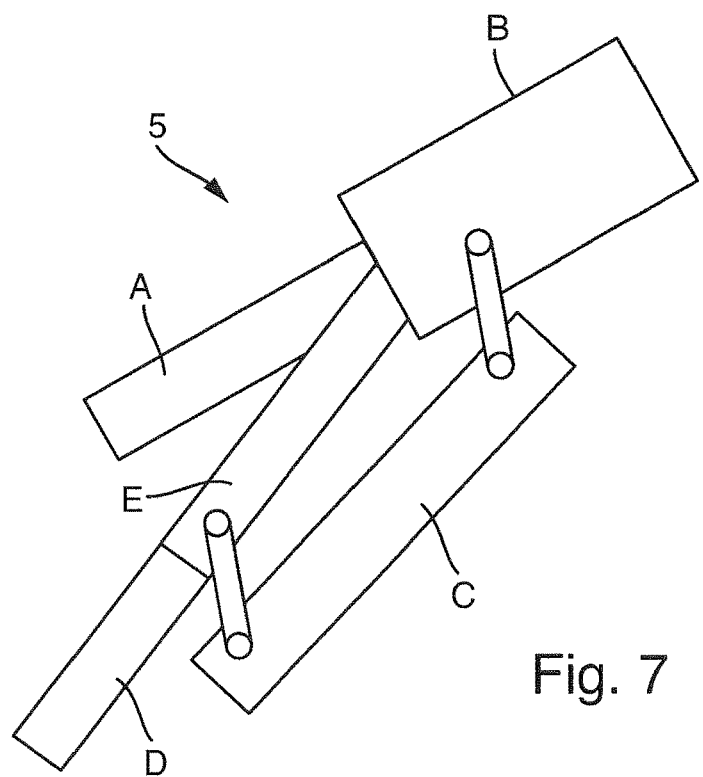
FIG. 7 is a sketch of an attenuating member having two lines with different Dk-values.

FIG. 7 shows a sketch of an attenuating member 5 with two lines with different Dk-values, instead of two lines with different lengths. This has the advantage that space on the circuit card can be saved. The circuit card must, however, be of at least two plies.

The invention claimed is:

1. A method for detecting high-frequency signals, comprising the steps as follows:
    dividing a high-frequency signal into a raw signal and a reference signal;
    attenuating the raw signal into an attenuated signal the attenuating happens as a function of frequency of the raw signal in accordance with an attenuation characteristic;
    rectifying the attenuated signal, so that a first direct voltage is generated;
    rectifying the reference signal, so that a second direct voltage is generated;
    ascertaining an attenuation from the ratio of the first and second direct voltages said ratio corresponds to an attenuation factor for the attenuation of the raw signal; and
    determining the frequency of the high-frequency signal from the attenuation factor and an attenuation characteristic;
    wherein the attenuating of the raw signal into an attenuated signal happens by distributing the raw signal to at least first and second lines of an attenuating member;
    said first and second lines have different lengths, whereby a frequency dependent phase difference arises between a first signal of the first line and a second signal of the second line; and
    the first and second signals are superimposed at an output of the attenuating member to form the attenuated signal.

2. The method as claimed in claim 1, wherein the first and second direct voltages are digitized, before the attenuation is ascertained.

3. A method for determining a physical or chemical process variable using at least one sensor, which produces high-frequency signals, whose frequency varies as a function of the at least one process variable, comprising steps as follows:
    detecting the high-frequency signals by means of a method as claimed in claim 1.

4. An apparatus for detecting high-frequency signals, comprising:
    a signal divider for dividing a high-frequency signal into a raw signal and a reference signal;
    an attenuating member for frequency dependent attenuating of the raw signal, said attenuating member has a defined attenuation characteristic;
    a first rectifier for rectifying the attenuated signal to a first direct voltage;
    a second rectifier for rectifying the reference signal to a second direct voltage;
    a comparator for forming the ratio of the first and second direct voltages; and
    a processor for ascertaining the frequency of the high-frequency signal from the attenuation of the raw signal and the attenuation characteristic of said attenuating member;
    wherein said attenuating member includes at least first and second lines for distributing the raw signal;
    said at least first and second lines have different lengths, so that a frequency dependent phase difference arises between a first signal of said first line and a second signal of said second line; and
    said attenuating member has a junction at an output for superimposing the first and second signals, so that said first and second signals are superimposed at said output into an attenuated signal.

5. The apparatus as claimed in claim 4, further comprising:
    an A/D converter for digitizing said first and second direct voltages.

6. An apparatus as claimed in claim 4, wherein:
    said signal divider is embodied as a Wilkinson divider.

7. A field device for measuring a physical or chemical process variable, comprising:
    at least one sensor, which produces high-frequency signals, whose frequency varies as a function of the at least one process variable, and an apparatus as claimed in claim 4, for evaluating the high-frequency signals.

* * * * *